United States Patent [19]
Heffner et al.

[11] Patent Number: 6,110,537
[45] Date of Patent: Aug. 29, 2000

[54] COATING INTEGRATED CIRCUITS USING THERMAL SPRAY

[75] Inventors: Kenneth H. Heffner; Curtis W. Anderson, both of Largo, Fla.

[73] Assignee: Honeywell Inc., Minneapolis, Minn.

[21] Appl. No.: 09/061,847

[22] Filed: Apr. 18, 1998

Related U.S. Application Data

[62] Division of application No. 08/751,146, Nov. 15, 1996, Pat. No. 5,762,711.

[51] Int. Cl.$^7$ ........................................................ C23C 4/12
[52] U.S. Cl. ............................ 427/448; 427/446; 427/96
[58] Field of Search ................................ 427/448, 96, 446

[56] References Cited

U.S. PATENT DOCUMENTS

| | | | |
|---|---|---|---|
| 4,031,268 | 6/1977 | Fairbairn | 427/448 |
| 4,115,600 | 9/1978 | Schroeder et al. | 427/123 |
| 4,596,718 | 6/1986 | Gruner | 427/425 |
| 5,648,123 | 7/1997 | Kuhn et al. | 427/448 |

FOREIGN PATENT DOCUMENTS

94/07611   4/1994   WIPO ................................ 427/448

*Primary Examiner*—Katherine A. Bareford
*Attorney, Agent, or Firm*—Robert A. Greenstien

[57] ABSTRACT

Protective and security coatings are applied to an integrated circuit by periodically passing the integrated circuit through a flame spray containing molten particles of the coating composition. The integrated circuit is attached to a fixture that is cooled with a coolant that is applied to the integrated circuit. The distance between the flame spray gun and the integrated circuit is controlled so that the particles are molten when they strike the circuit but the circuit heating is minimized. A flame resistant mask retains the integrated circuit on the fixture. The mask is constructed of a low thermally conductive material and the fixture is constructed of a high thermally conducive material.

4 Claims, 7 Drawing Sheets

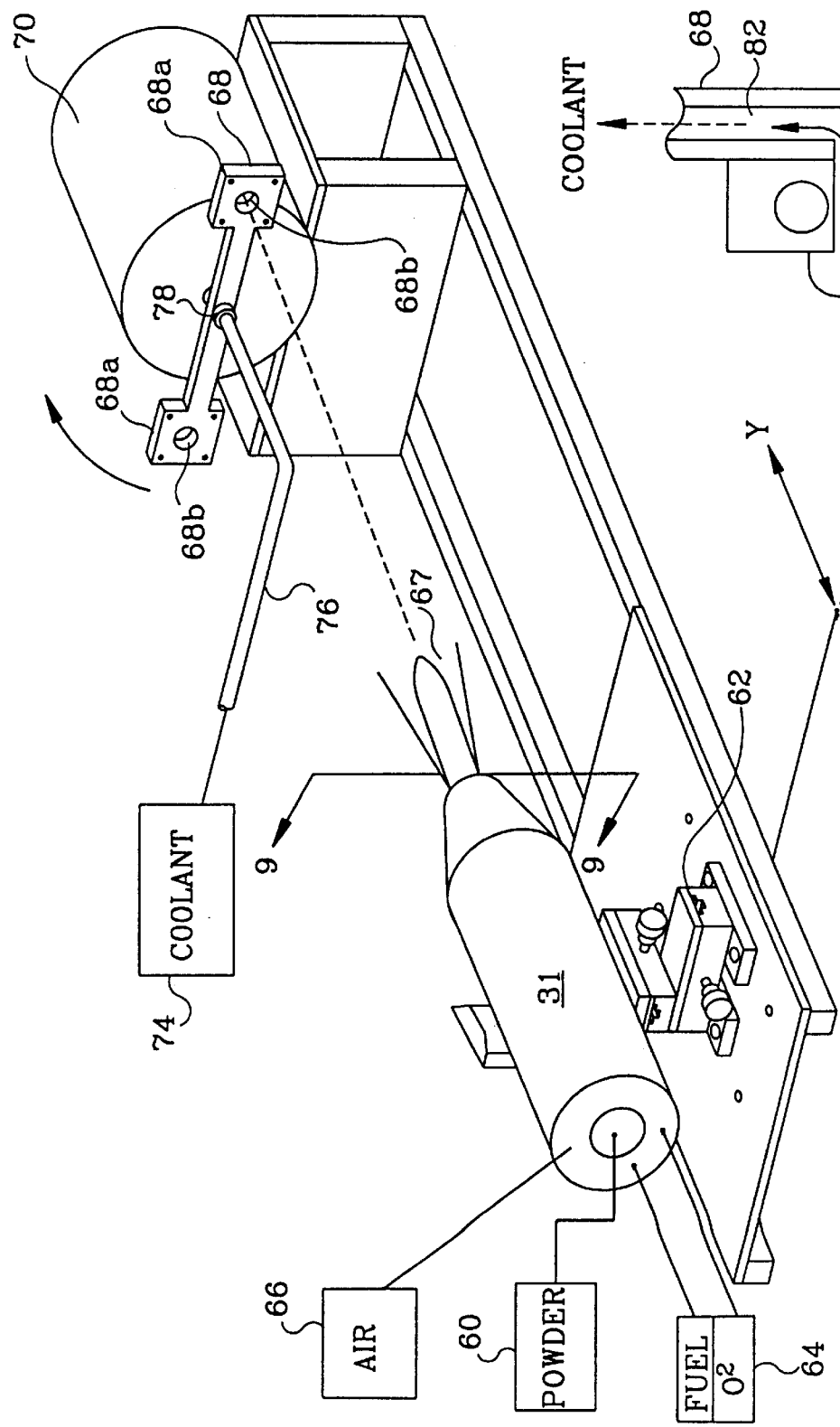

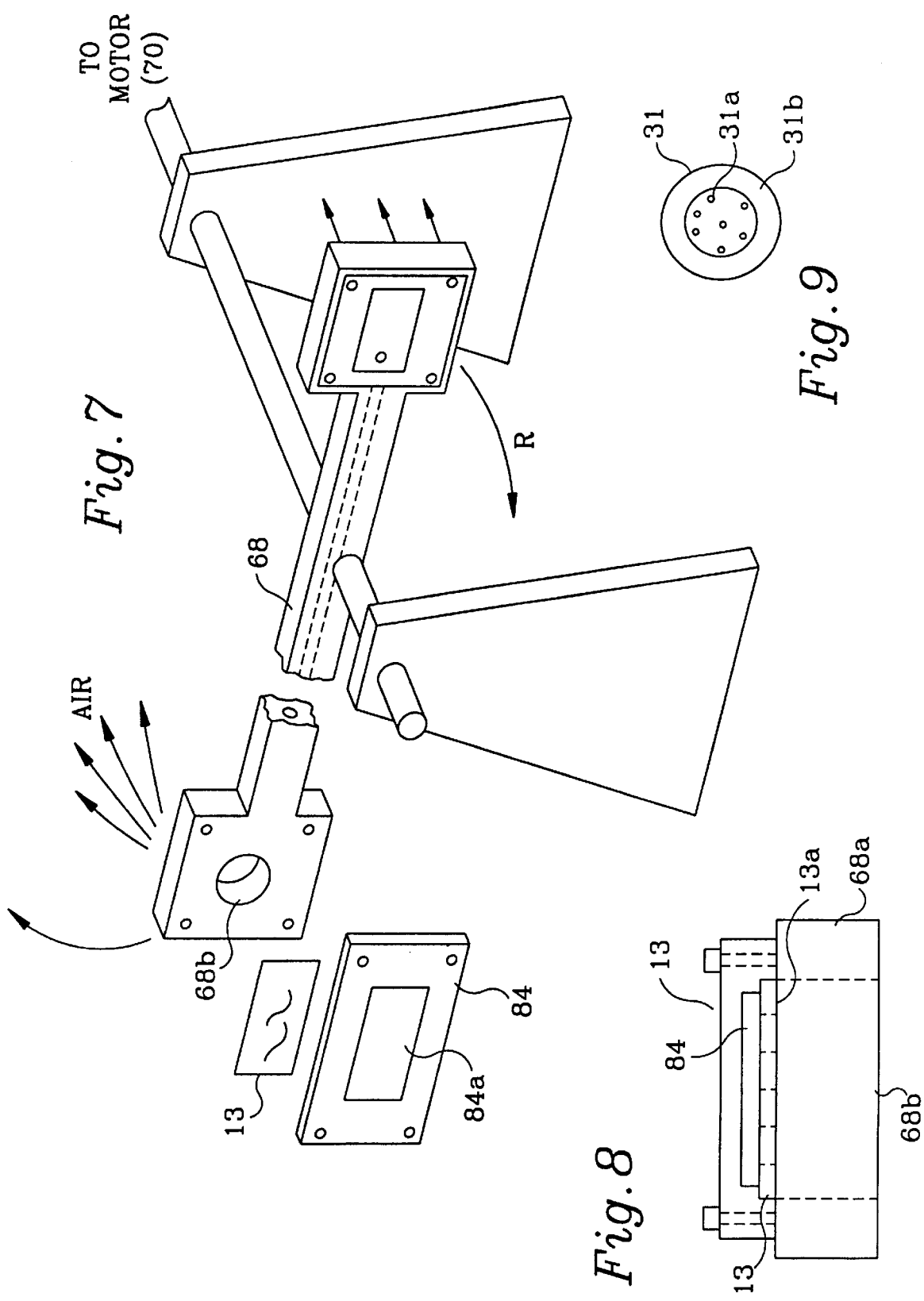

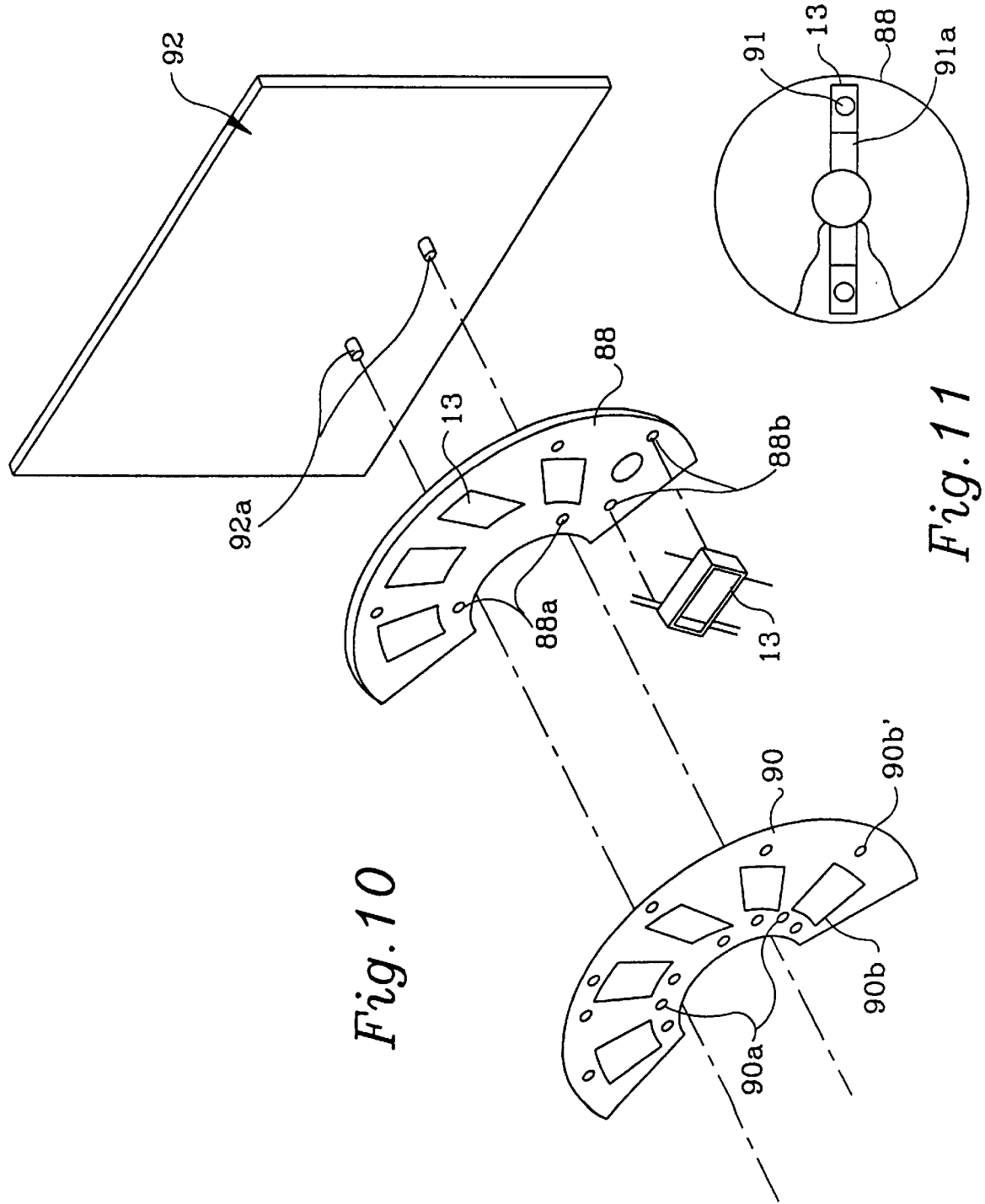

COATING INTEGRATED CIRCUITS USING THERMAL SPRAY

This is a division of application Ser. No. 08/751,146, filed Nov. 15, 1996 now U.S. Pat. No. 5,762,711.

CROSS-REFERENCE TO RELATED APPLICATIONS

The subject matter of this application is related to the subject matter of these commonly owned, applications: Multilayer Protective Coating for Integrated Circuits, filed Oct. 27, 1995, Ser. No. 08/549,349; Protective Coating and Organic Primer for Integrated Circuits and Multichip Modules and Method of Applying Same, Ser. No. 08/549,351, filed Oct. 27, 1995, now U.S. Pat. No. 5,877,093; and Protective Coating Integrated Circuits and Multichip Modules and Method of Applying the Protective Coating, Ser. No. 08/549,350 filed Oct. 27, 1995.

TECHNICAL FIELD OF THE INVENTION

This invention relates to techniques for applying protective and security coatings to integrated circuits, multichip modules and other electronic devices.

BACKGROUND OF THE INVENTION

Electronic circuits, such as integrated circuits and multichip modules, are coated for protection from tampering and to inhibit reverse engineering, and U.S. Pat. No. 5,366,441 to Bearinger et al. and U.S. Pat. No. 5,258,334 to Lantz et al. are illustrative of conventional coating techniques that apply a coating composition to the circuit as a liquid using a mask and then heat the coated circuit to cure the coating. The coating may consist of a silica precursor, such as hydrogen silsesquioxane resin (H-resin), and a filler. Following the teaching in Bearinger, the microcircuit die with the precursor coating is heated in a Lindberg furnace to a temperature greater than 400° C. for up to six (6) hours, which converts the coating to a glass or ceramic matrix. The filler may be a material that absorbs (attenuates) x-rays to provide a coating that yields an opaque image under radiographic and/or visual inspection. The resin may simply be an opaque resin to conceal the circuit (preventing visual inspection). Lantz also employs a secondary coating that is applied using chemical vapor deposition (CVD)and/or ion beam methods. A disadvantage with these techniques, the coating mixture is applied to a partially fabricated circuit (i.e., die surface), before the die attachments, wire bonds and other circuit connections are made. Because the coating does not cover the final circuit, any electromagnetic and radiation shielding is marginal at best and ineffective for extreme conditions, such as spacecraft and nuclear facilities. Techniques like Bearinger and Lantz also require long processing times and high processing temperatures, making them unacceptably risky for coating delicate circuits and impractical for mass producing low cost coated circuits. Another drawback, specific to Lantz process, is that depositing the secondary coating requires costly, complex deposition chambers and long processing times.

DISCLOSURE OF THE INVENTION

An object of the present invention is to apply protective coatings and security coatings to circuits, such as integrated circuits and multichip modules, and similar delicate electronic circuits.

Another object of the present invention is to provide a low power, repeatable, high volume process for applying uniform, precisely thick protective and security coatings to integrated circuits and multichip modules and similar delicate electronic components and assemblies.

According to the invention, molten droplets, sprayed from a torch, gently impact the circuit where they cool and solidify. The distance between the torch and the circuit is controlled so that the droplets remain molten at the point of impact with the circuit but without applying excessive heat to the circuit. The size/mass of the droplets are selected to minimize the force applied to the circuit components. A desired layer of the coating composition (hardened once cooled) is built up over all the circuit components by making successive passes over the circuit. The integrated circuit is placed on a fixture that is constructed from a material with good heat conduction properties, such as aluminum, with coolant applied to the fixture to cool the fixture and the integrated circuit.

According to the invention, a feedstock material, such as a high density, heavy metal for radiation protection, in particle, rod or wire form is injected into the heat source (flame or-plasma) of a thermal spray gun, which melts the feedstock material into molten drops that are propelled onto the circuit by the flame (heat source).

According to the invention, a mask is placed over regions of the circuit where coating is not desired. The mask is constructed of a heat resistant material that is not a good heat conductor.

According to one aspect of the invention, the fixture is rotated through the heat source and the heat source is indexed across the integrated circuit, multichip module or hybrid circuit to produce a coating with a desired thickness.

Other objects, benefits and features of the invention will be apparent from the following discussion of one or more embodiments.

BRIEF DESCRIPTION OF THE DRAWING

FIG. 5 shows a coating applicator according to the present invention.

FIG. 6 is an elevation of a bearing used in the fixture shown in FIG. 5.

FIG. 7, an enlarged perspective view of a rotated applicator arm to which the integrated circuits are attached in the applicator shown in FIG. 5, contains a cut-away section to expose cooling line paths within the arm.

FIG. 8 is an elevation of an integrated circuit attached to the arm.

FIG. 9 is an a section along line 9–9 in FIG. 5, revealing the nozzle configuration for the thermal gun.

FIG. 10 shows an alternative arrangement (two attached disks) to the arm in FIG. 5 for holding the circuit during a coating application according to the invention.

FIG. 11, a front elevation of the two disks containing a circuit, contains a cutaway to reveal the coolant passages therein.

BEST MODE FOR CARRYING OUT THE INVENTION

The Coated Circuit

Figure 1:
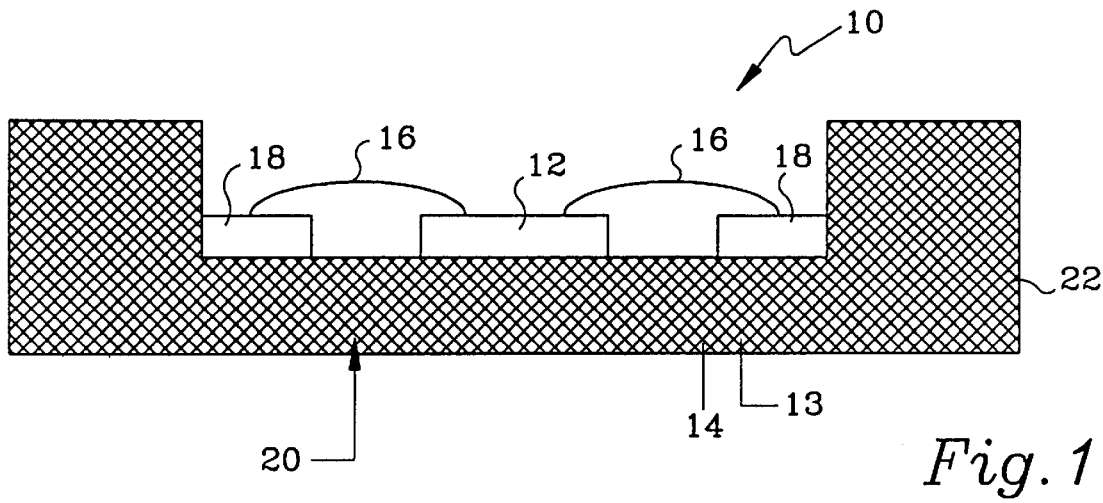
FIG. 1 is an elevation a bare integrated circuit.

An integrated circuit (IC) or multichip module (MCM) 10 suitable for coating according to the present invention is illustrated in FIG. 1. The circuit 10 includes chips (die) 12, and these are mounted on a surface 13 of a substrate 14. Conductors or lead wires 16 connect the chip to pads 18 that serve as ports for electrical connections to external sources (not shown). The substrate 14, with the chips 12 and pads 18, can be packaged in a ceramic package having a lid and seal (not shown) that are inserted on the ceramic base that supports the circuit 10.

Figure 3:
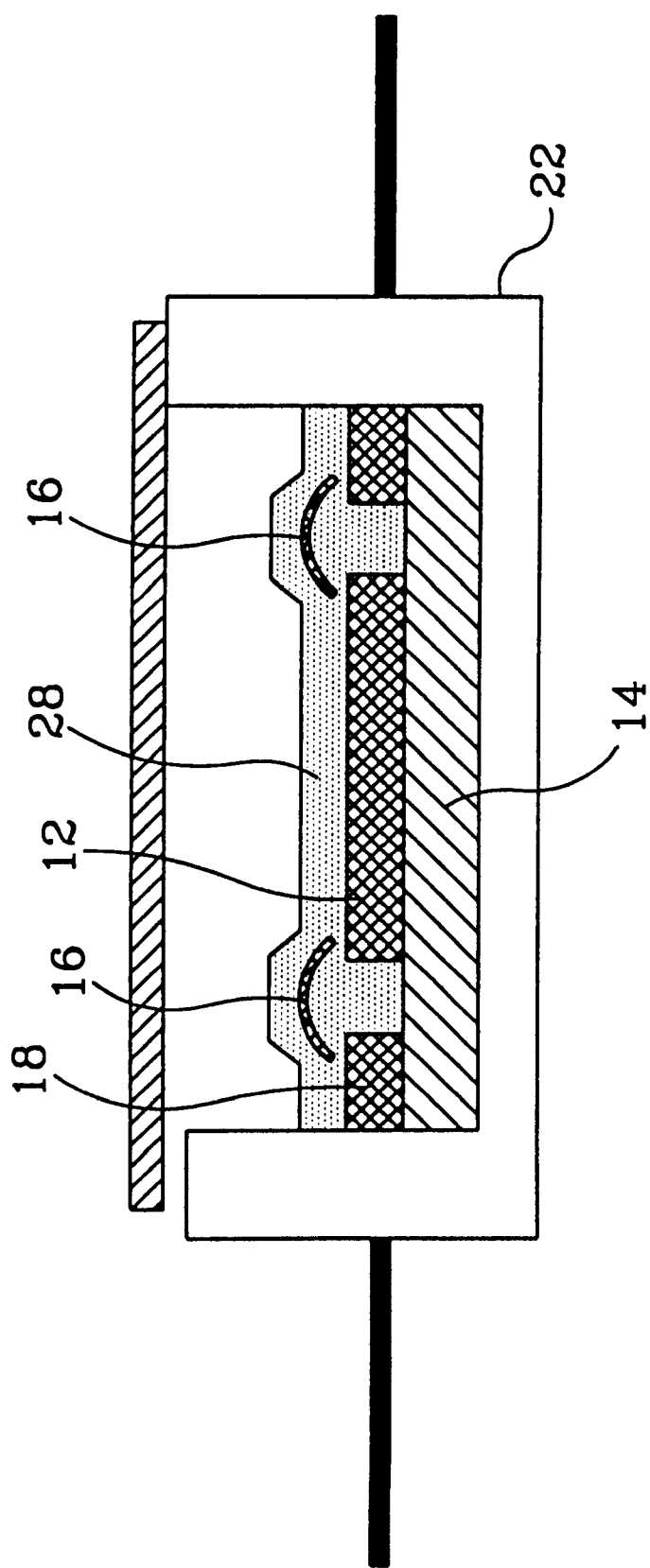
FIG. 3 is an elevation of a circuit coated according to the present invention.
Figure 4:
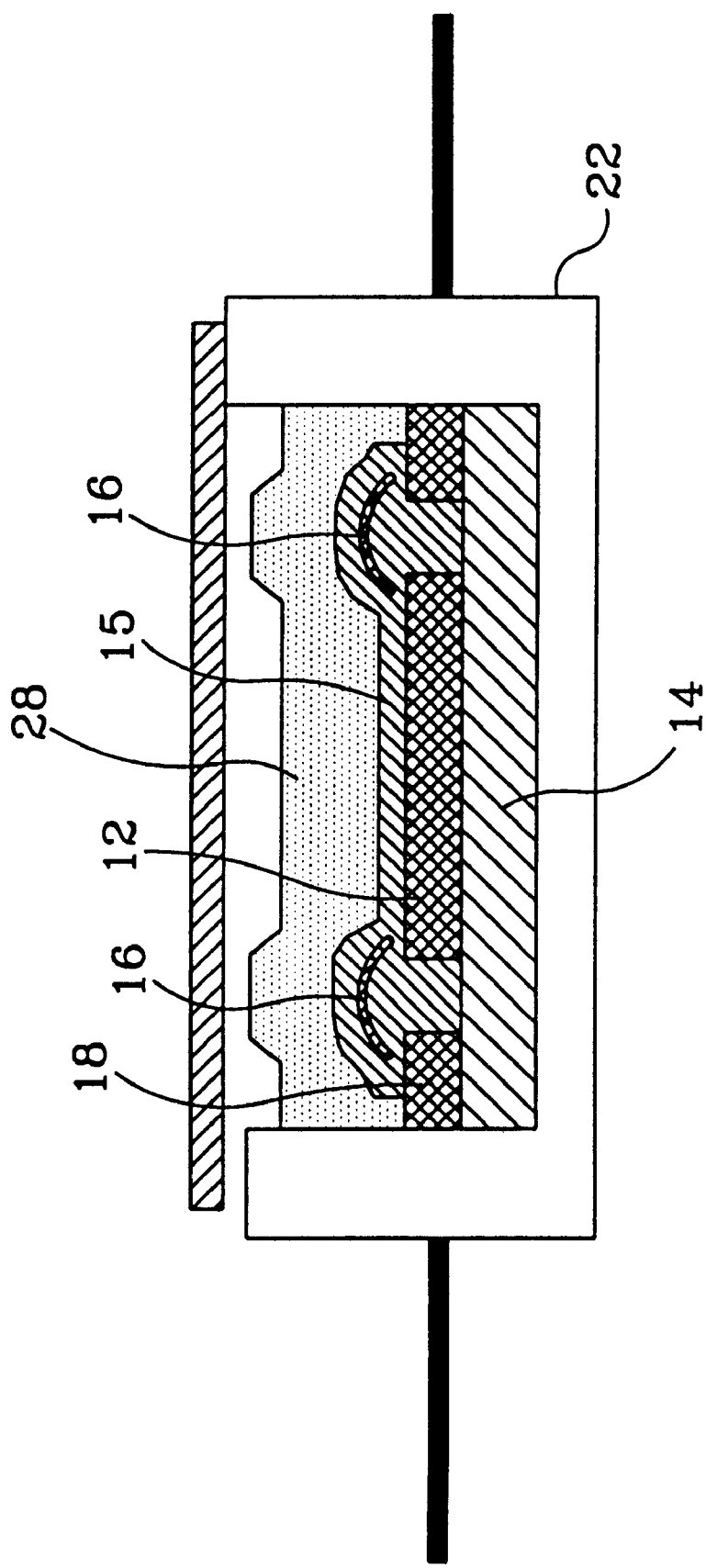
FIG. 4 is an elevation of a circuit containing an intermediate or primary coating according the present invention.

The circuit 10 maybe coated with just a protective opaque coating 28 (see FIG. 3) using a thermal spray process 29, which is illustrated in FIG. 3. On the other hand, as shown in FIG. 4., the circuit may be prepared first with an organic based film, primer coating 15 applied by reactive vacuum deposition, thermal spray or liquid coating processes. The primer coating composition is selected from materials that bond with the circuit 10, such as Parylene polymer, a solid thermoplastic, a solid siloxane or a thermoset based liquid polymer. Reactive vacuum deposition can be used to apply Parylene, thermal spray deposition to apply thermoplastic and siloxanes, and liquid drop deposition to apply furfural based polymer. As shown in FIG. 4, the formed primer coating 15 completely covers the semiconductor chip(s) 12, lead wires 16, pads 18 and the surface 13 of the substrate 14 housed within the base 22. However, the primer 15 may be applied partially or completely of less than all the semiconductor chip(s) 12, leads 16, pads 18 and/or surface 13. Once formed, the primer coating 15 has a thickness within the range of 0.1 mils to 2 mils. The primer coating 15 is applied before the protective opaque coating 28 to enhance the resistance of the circuit 10 to mechanical and/or thermal damage when the molten particles 35 strike the circuit 10. This can be especially important when the circuit 10 is electronically delicate. For example, some integrated circuits and multichip modules have thin wire connections and delicate die.

Figure 2:
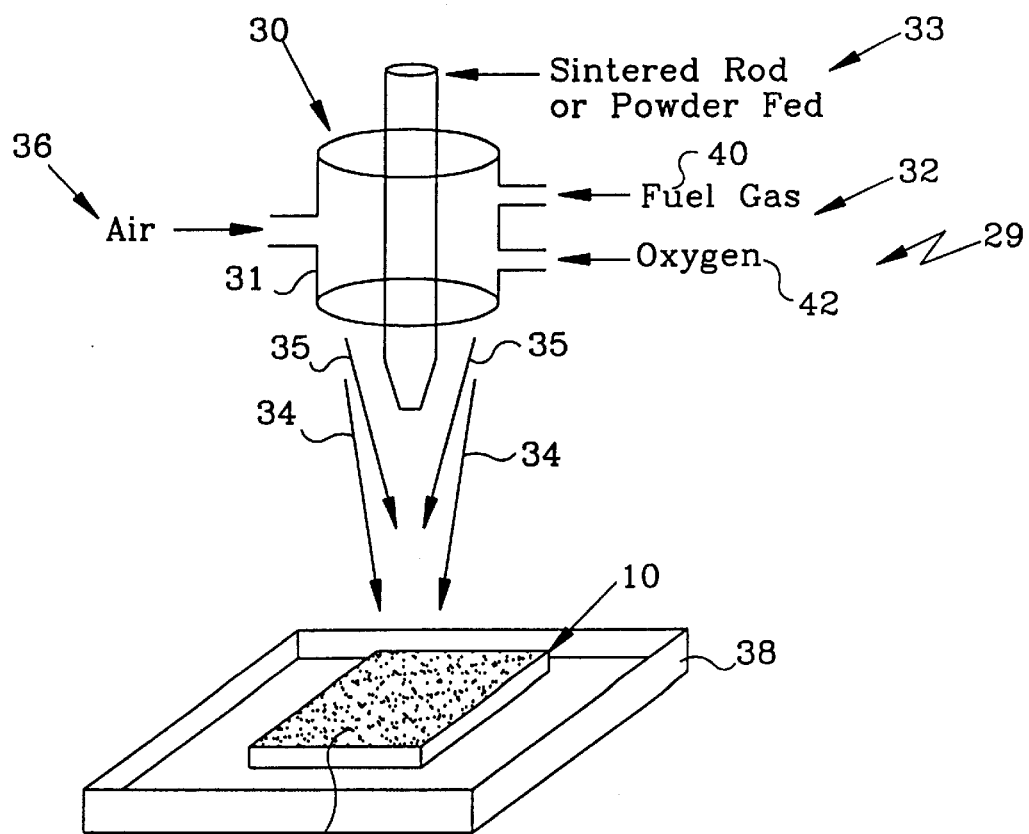
FIG. 2 is a functional diagram of a thermal gun that may used to apply coatings according to the present invention.

The circuit 10 can be coated with a protective opaque coating 28 (see FIG. 3) by a thermal spray process using the elements illustrated in FIG. 2. For some applications, a primer coating 15 is applied first and allowed to form (i.e., cure). The circuit 10 is next coated with the protective opaque coating 28 (see FIG. 3) by the thermal spray system in FIG. 2. This is a line of sight coating process that uses a thermal spray gun 30 having a nozzle 31. Heat from a source 32 is supplied to the nozzle 31 to melt a ceramic particle-based feedstock composition 33, that is, injected into to the nozzle 31. The heat source 32 may be a flame or plasma 34 and melts the composition 33, producing molten particles (droplets) 35. The particles 35 are propelled at the circuit 10 by the expanding gasses in the nozzle 31, and the circuit 10 is supported on a support 38 that acts as heat sink, removing heat from the circuit 10 during the spray process.

The chemistry of the composition 33 should be compatible with the materials of the circuit 10 so that removal of the protective coating 28 (for inspection and/or reverse engineering of the topology of the circuit) via chemical methods will destroy the circuit 10. The feedstock for the composition 33 may be a single chemical component or a multi-chemical component composition, partially or entirely formed from any one of the following: alumina, beryllia, silica, silicon carbide, aluminum nitride, fused alumina-titanium oxide, fused alumina-titanium dioxide and organic, polymeric coatings The feedstock composition 33 is prepared by packaging the chemical materials of the feedstock composition 33 into a powder, wire or sintered rod. Powders should have particle sizes within the range of ten microns to sixty microns. Particle sizes in excess of sixty microns tend to cause mechanical damage to the circuit 10 when they strike the circuit 10. Particle sizes less than ten microns tend produce a liquid stream (rather than molten liquefied particles 35), which may be difficult to control during the application process. In one preferred embodiment, a coating composition 33 with a particle size between ten microns and twenty microns provided good results.

As explained previously, the heat source 32 can be a plasma arc, an electric arc or an ignited fuel gas, such as acetylene and oxygen, which is capable of producing sufficient melting temperatures in the range of 200 EC and 1500 EC. The molten particles 35 splatter on impacting the circuit 10, where they coalesce, forming a continuous coating or shell, the thickness of which is built-up with successive depositions of the molten, liquefied particles 35. The result is a lamellar protective, opaque coating 28 over the entire circuit. A carrier gas jet 36 of pressurized air can be delivered to the nozzle 31 at approximately 100 cfm to create a sufficient spray for the molten particles. For that purpose, the nozzle contains jets 31a for the fuel/oxygen combustion mixture and an annular jet 31b for the air, which cools the nozzle and shapes the flame that carries the molten composition to the circuit 10, as shown in FIG. 9.

As shown in FIG. 2, the nozzle 31 is positioned above the circuit 10, which is held in place by the support element 38 and draws heat away from the circuit 10 during the application process. Typically, the nozzle 31 is positioned five inches and seven inches from the circuit 10. The molten liquefied particles 35 can be applied in successive layers or as a single burst depending upon the desired coating thickness and the thermal limitations of the circuit 10. The particles 35 can be applied by moving the nozzle 31 back and forth over the surface of the circuit 10, e.g., using the apparatus discussed below, or by moving the circuit 10 relative to the nozzle 31. A satisfactory thickness for the coating 28 is in the range of between 1 to 100 mils.

The lamellar protective opaque coating is bonds/adheres to the surface of the circuit 10 and is abrasion resistant, providing an hermetic-like seal, preventing both active and passive, chemical, optical and radiation inspection and/or reverse engineering of the circuit 10. As illustrated in FIG. 3, the protective opaque coating 28 completely covers the semiconductor chips 12, lead wires 16, pads 18 and the surface 13 of the substrate 14 housed within the base member 22. However, it should be understood that the protective, opaque coating 28 may cover selected chips 12, leads 16, pads 18 and/or surface 13 through appropriate masking. Once the protective opaque coating 28 is applied, a seal and lid may be used to seal the top of the circuit 10. Alternatively, a plastic encapsulating coating may be applied.

The molten liquefied particles 35 can be applied to the surface of the circuit 10 (to achieve complete coverage as shown in FIG. 3) in 15 to 600 seconds. The protective opaque coating 28 can be fully cured and cooled and the circuit 10 ready for use in only 1 to 70 minutes. Therefore, it can be appreciated that the invention provides a fast, inexpensive way to mass produce secure, resilient integrated circuits and multichip modules.

FIG. 4 shows another application for the invention. Once the opaque coating 28 is formed (i.e., cured), the circuit 10 is then coated with a radiation hardening coating 50 or an electromagnetic interference (EMI) hardening coating 52. The radiation hardening coating 50 shields the circuit 10 from the adverse affects of high energy radiation, while the EMI hardening coating 52 shields the circuit 10 from the adverse affects of EMI.

Unlike the opaque coating 28, the shield coatings 50 and 52 can be produced from powder-based feedstock compositions. Heavy metals (and compounds of a heavy metals) including the following provide sufficient radiation attenuation in the coating thickness described herein: Hf, Ta, W, Re, Os, Ir, Pt, Au, Ti, Pb, Bi, Ba, Ce, Pr, Nd, Pm, Sm, Eu, Gd, Th, Dy, Ho, Ef, Tm, Yb, Lu, and La. As with the radiation shielding, the EMI feedstock compositions may be a single chemical component or a multi-chemical component compositions. The composition of the EMI coating 52 may be any one of titanium monoxide, chromium carbide, zinc, copper or other electrically conductive metals. In one embodiment, titanium monoxide was found to provide a desirable composition for the EMI coating.

The radiation shielding enhancement and EMI coatings 50 and 52 can be applied by the thermal spray process 29 with the form of the compositions for the coatings 50 and 52 being sintered rod or wire to produce particle sizes from ten to sixty microns (ten to twenty microns being preferred), to avoid damaging the circuit 10. Flame temperatures between 200 EC to 3000 EC) have been used with particles of that size.

Figure 12:
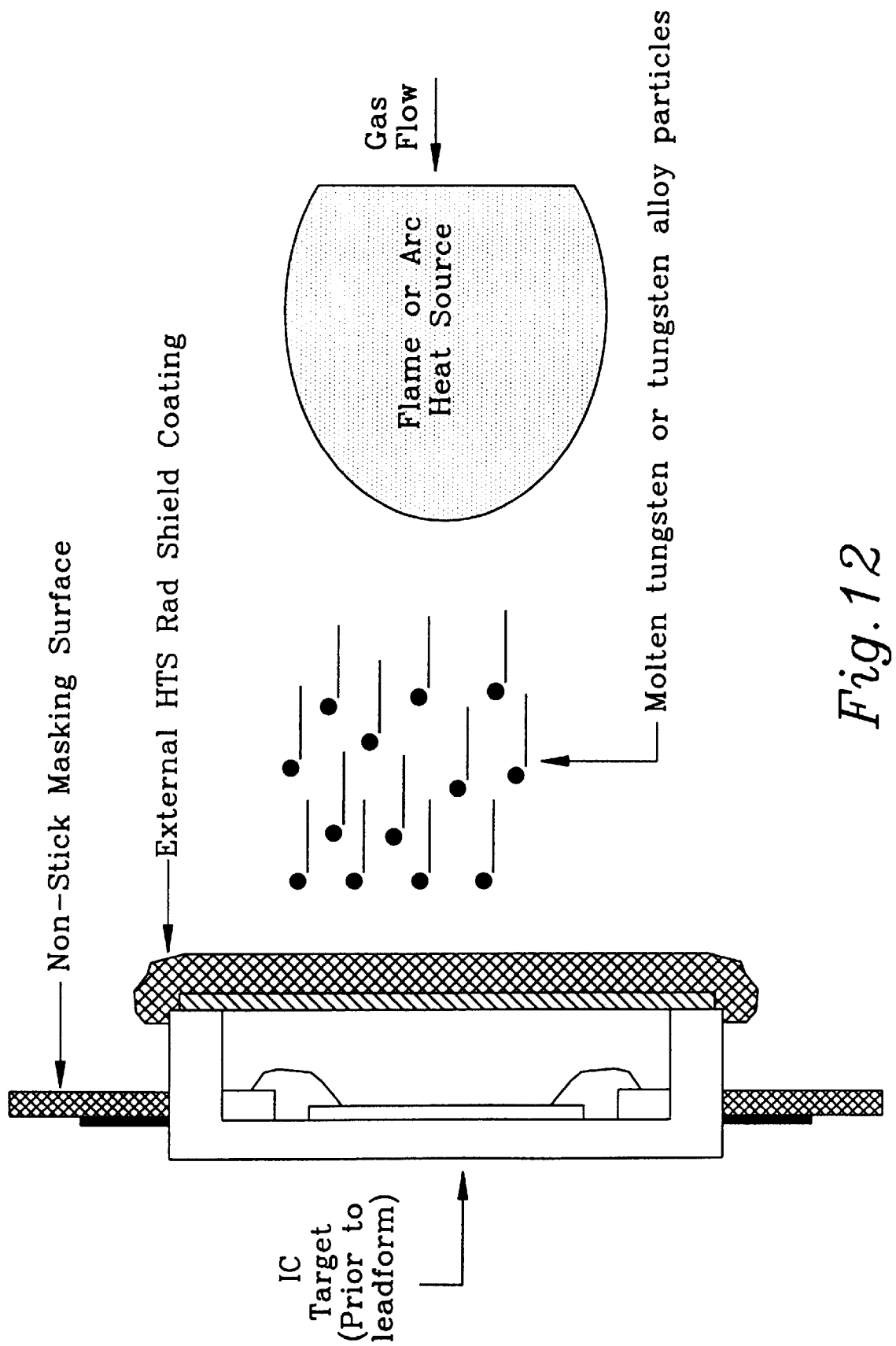
FIG. 12 is a cutaway of a multichip module with an attached lid that is coated with a protective coating according to the present invention.

As shown in FIG. 4, the formed EMI coating 52 and the formed radiation coating 50 completely cover the opaque coating 28 the primer coating 15 (if used), semiconductor chip(s) 12, lead wires 16, pads 18 and the surface 13 of the substrate 14 housed within the base member 22. As with the opaque coating, the EMI coating 52 and the radiation coating 50 may be applied selectively to some portions of the circuit with masking. Good attenuation has resulted from the use of the above materials with a coating between 0.1 mil and 200 mils. Radiation and EMI coatings can be applied to the exterior of a packaged circuit, after a lid and seal are installed or the circuit is sealed in thermoplastic, as shown in FIG. 12.

The primer coating composition can be applied and cured to the primer coating 15 (to achieve complete coverage as shown in FIG. 4) in 1 to 60 minutes. The molten liquefied particles 35 can be applied and formed over the insulating coating 15 on the surface of the circuit 10(to achieve complete coverage as shown in FIG. 3) in 15 to 600 seconds. The radiation coating 50 can be applied and formed over the opaque coating 28 (to achieve complete coverage as shown in FIG. 3) in 15 to 600 seconds. The EMI coating 52 can be applied and formed over the radiation coating 50 (to achieve complete coverage as shown in FIG. 3) in 15 to 600 seconds. The multiple layers of coating can be fully applied and cooled and the circuit 10 can be ready for use in 2 to 80 minutes.

Apparatus for Coating the Integrated Circuit

In FIG. 5, particles of a coating composition are supplied from a composition feedstock supply 60 to the thermal spray gun 31. The gun 31 is mounted on an X-Y positioning rack 62. Fuel and oxygen are supplied to the gun 31 from a fuel/oxidant supply 64 and air is supplied from a air supply 66. The air acts as a nozzle coolant for the flame front 67, which contains a composition particles that are melted by the flame as it exits the nozzle coolant outlet 31*b*, in FIG. 9, which is concentric to fuel/oxygen outlets 31*a*. The molten particles are aimed at a pair of arms 68. The arm ends 68*a* receive an integrated circuit 13 (also see FIG. 7). The arm 68 is rotated by an electric motor 70. A coolant, such as compressed air, is pumped into the arms from a coolant supply through a pipe or hose that connects to a coolant slip ring 78. The coolant flows (arrows 80) from the slip ring to coolant passages 82. Those passages extend radially along the interior of each arm and each arm end is bored out with a coolant discharge port 68*b*, which is supplied with the coolant by the coolant passage 82. The coolant flows through the interior of the arm, through the coolant passage 82 and exits through the coolant discharge port 68*b*.

Referring to FIG. 7, the integrated circuit 13 is attached to the arm 68 with a metal mask plate 84 that contains a coating aperture 84*a*. The arm 68 is made of a metal that is a very good heat conductor, such as aluminum, while the mask 84 is made of metal that is flame resistant but not an especially good thermal conductor. The arms 68 efficiently remove heat from the integrated circuit, which the mask 84 acts as shield and does not efficiently conduct heat from the arm or the flame to the integrated circuit. Air flow in the discharge flows across the bottom of the integrated circuit, removing more heat from the integrated circuit.

The arms rotates at a rate 1,000 rpm, sweeping the integrated circuit through the flame front. With each pass, the layer of cooled, molten coating particles builds up on the top or circuit side of the integrated circuit 13. As a practical matter, the deposition of coating material is a small swath along the circuit in the direction of rotation R, and as the arm 68 rotates, the torch 31 is indexed in the X-direction so that the coating covers the entire region defined by the mask aperture 84*a*. The distance from the torch 38 to the arm is adjustable in the Y direction, as shown in FIG. 5. The desired distance is one at which circuit heating is minimal, e.g., the circuit is no more than 100 EC and the composition is still molten when it impacts the circuit.

FIGS. 10 and 11 illustrate a variation on the apparatus shown in FIG. 6 and 7. Instead of processing two integrated circuits, many more integrated circuits may be clamped on a disk 88 using a mask disk 90 with an aperture 90*a* to expose part of the integrated circuit 13. The disk 88 is made of an efficient heat conductor, such as aluminum, but the mask 90 is made from a metal that is a less efficient heat conductor, such as stainless steel. When installing the integrated circuit 13 on the disk 88, the disk 88 and mask 90 are installed an assembly stand 92 that has alignment pins 92*a* to receive a alignment holes 90*b* and 90*b*, which retain and align the disk 88 and mask 90 as the integrated circuits 13 are inserted and individually clamped in place by screws (not shown) that are inserted in the holes 88*b*, 90*b*. Like the arm 68, the disk 88 contains internal coolant outlets 91 that connect with internal coolant passages 91*a*. The coolant flow cools the disk 88 and the outlet flow also cools the integrated circuit.

Although the present invention has been described with reference to preferred embodiments one of ordinary skill in the art will be able to make modifications and changes, in addition to any already described, in whole or in part to the components and devices described above to carry out the invention without departing from the spirit and scope of the invention.

We claim:

1. A method characterized by:

attaching an integrated circuit to a fixture;

attaching the fixture to an electric motor to rotate the fixture;

activating the electric motor to rotate the integrated circuit repeatedly on a first plane to pass the integrated circuit through a thermal flame spray comprising a flame carrying molten particles produced at a first distance from the fixture;

injecting particles into a flame spray device to transform the particles to molten droplets and produce said thermal flame spray; and moving the flame spray device along a second plane parallel to said first plane and at said first distance to spray a selected area of the integrated circuit to cause the molten particles to impact and coat the selected area.

2. The method described in claim 1, further characterized by:

passing a coolant through the interior of the fixture to cool the integrated circuit and the fixture as the fixture is rotated.

3. The method described in claim 2, further characterized by:

supplying the coolant to a passage that is inside the fixture and that has outlet for directing the coolant along a surface of the integrated circuit.

4. The method described in claim 3, further characterized by:

placing the circuit between a coating mask and the fixture and fastening the mask to the fixture to hold the integrated circuit on the fixture.

* * * * *

UNITED STATES PATENT AND TRADEMARK OFFICE
CERTIFICATE OF CORRECTION

PATENT NO. : 6,110,537
DATED : August 29, 2000
INVENTOR(S) : Kenneth H. Heffner and Curtis W. Anderson It is certified that error appears in the above-identified patent and that said Letters Patent is hereby corrected as shown below:

Column 1,
Line 3, insert:
-- The United States Government may have certain rights to this invention under government contract MDA904-92-C-7066. --

Signed and Sealed this

Twenty-first Day of June, 2005

JON W. DUDAS
*Director of the United States Patent and Trademark Office*